United States Patent
Li et al.

(10) Patent No.: US 10,530,239 B2
(45) Date of Patent: Jan. 7, 2020

(54) FILTER SYSTEMS FOR REDUCING BEARING CURRENT IN HIGH-FREQUENCY MOTOR CONTROL SYSTEMS

(71) Applicant: Regal Beloit America, Inc., Beloit, WI (US)

(72) Inventors: Ming Li, Fort Wayne, IN (US); Roger Carlos Becerra, Fort Wayne, IN (US)

(73) Assignee: Regal Beloit America, Inc., Beloit, WI (US)

( * ) Notice: Subject to any disclaimer, the term of this patent is extended or adjusted under 35 U.S.C. 154(b) by 0 days.

(21) Appl. No.: 15/911,835

(22) Filed: Mar. 5, 2018

(65) Prior Publication Data

US 2019/0273429 A1    Sep. 5, 2019

(51) Int. Cl.
| | | |
|---|---|---|
| H02P 29/50 | (2016.01) | |
| H02M 1/12 | (2006.01) | |
| H01F 27/26 | (2006.01) | |
| H02H 9/00 | (2006.01) | |
| H02M 1/44 | (2007.01) | |
| F16C 32/04 | (2006.01) | |
| G01R 19/25 | (2006.01) | |
| H01F 17/00 | (2006.01) | |

(52) U.S. Cl.
CPC .......... *H02M 1/126* (2013.01); *F16C 32/0451* (2013.01); *G01R 19/2509* (2013.01); *H01F 27/266* (2013.01); *H02H 9/005* (2013.01); *H02M 1/44* (2013.01); *H02P 29/50* (2016.02); *H01F 2017/0093* (2013.01); *H02M 2001/123* (2013.01)

(58) Field of Classification Search
CPC .......... H02M 1/126; H02M 1/44; H02P 29/50; H02H 9/005
USPC ...................................................... 318/400.26
See application file for complete search history.

(56) References Cited

U.S. PATENT DOCUMENTS

| | | | | |
|---|---|---|---|---|
| 5,467,262 A | * | 11/1995 | Nakata | ...................... B60L 9/22 363/41 |
| 6,208,098 B1 | * | 3/2001 | Kume | .................... H02M 1/126 318/400.25 |
| 7,957,166 B2 | | 6/2011 | Schnetzka et al. | |

(Continued)

FOREIGN PATENT DOCUMENTS

WO    2012109703 A1    8/2012

*Primary Examiner* — Kawing Chan
(74) *Attorney, Agent, or Firm* — Armstrong Teasdale LLP

(57) ABSTRACT

A motor controller and methods for operating a motor are described herein. The motor controller includes a high-frequency (HF) inverter having a direct current (DC) input stage and an alternating current (AC) output stage, the HF inverter operable at a switching frequency to generate a three-phase output having a fundamental frequency. The motor controller also includes a differential mode (DM) filter coupled in series with the output stage of the HF inverter and having a resonant frequency less than 10% of the switching frequency, the DM filter configured to reduce harmonic components of the three-phase output and generate a first filtered output. The motor controller further includes a common mode (CM) filter coupled in series with the DM filter, the CM filter configured to filter the first filtered output to generate a second filtered output having a reduced CM voltage to operate the electric motor with a reduced bearing current.

18 Claims, 8 Drawing Sheets

(56) References Cited

U.S. PATENT DOCUMENTS

| | | | |
|---|---|---|---|
| 7,994,876 B2* | 8/2011 | Feng | H02M 1/126 333/172 |
| 8,325,500 B2* | 12/2012 | Schueneman | H02M 1/126 363/47 |
| 9,331,594 B2 | 5/2016 | Gu et al. | |
| 9,350,315 B1* | 5/2016 | Gonzalez Moreno | H03H 7/24 |
| 9,444,390 B2 | 9/2016 | Yeo et al. | |
| 9,479,105 B2 | 10/2016 | Rozman et al. | |
| 9,613,745 B2 | 4/2017 | Shudarek et al. | |
| 2006/0043920 A1* | 3/2006 | Baker | H02M 1/126 318/611 |
| 2010/0148581 A1* | 6/2010 | Gupta | B60L 1/003 307/30 |
| 2010/0244760 A1* | 9/2010 | Anwar | G01R 31/025 318/490 |
| 2012/0014143 A1* | 1/2012 | Schueneman | H02M 1/126 363/40 |
| 2014/0104901 A1* | 4/2014 | Nguyen | H02M 1/126 363/48 |
| 2014/0265641 A1* | 9/2014 | Inoue | H02M 7/48 307/151 |
| 2015/0318103 A1* | 11/2015 | Rozman | H01F 27/24 363/44 |
| 2015/0349694 A1 | 12/2015 | Feng et al. | |

* cited by examiner

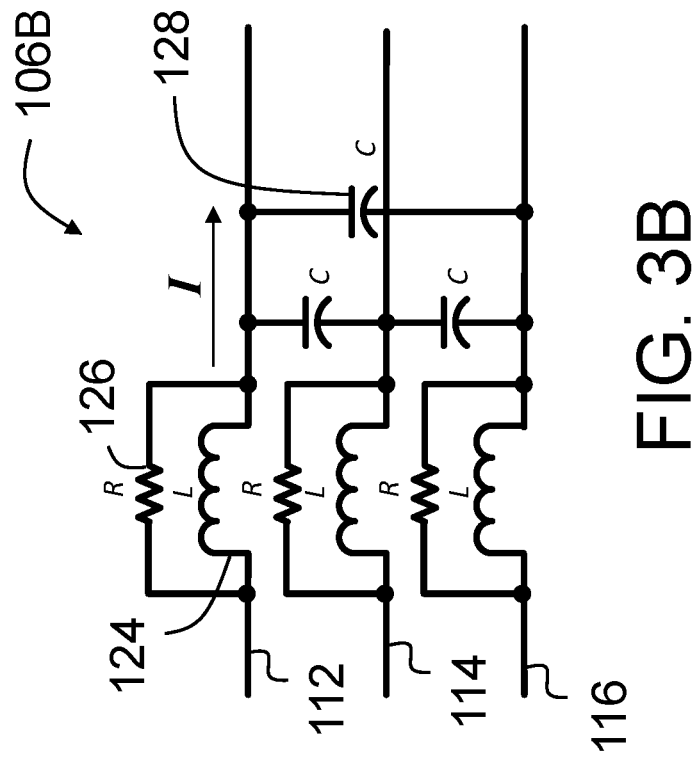
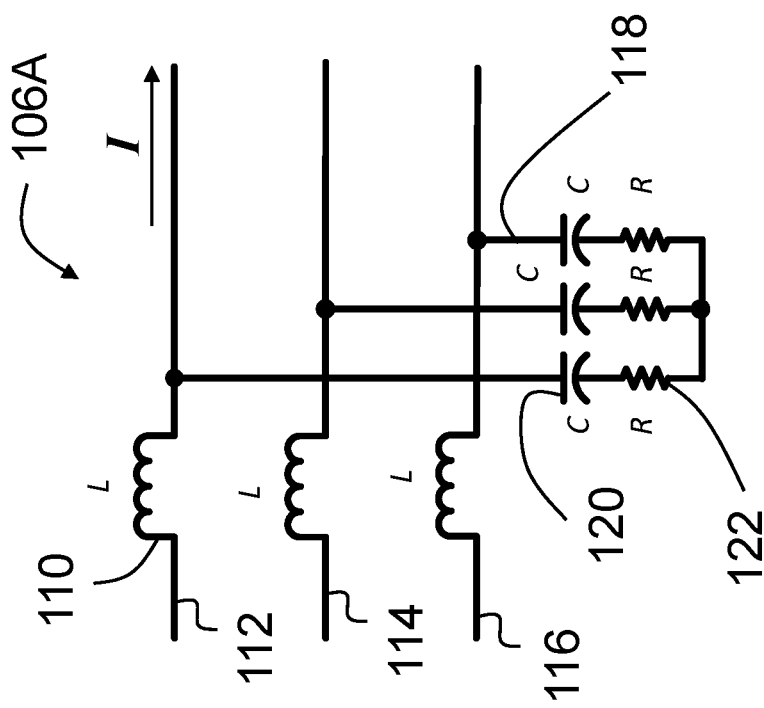
FIG. 3A
FIG. 3B

FILTER SYSTEMS FOR REDUCING BEARING CURRENT IN HIGH-FREQUENCY MOTOR CONTROL SYSTEMS

BACKGROUND

The field of the disclosure relates generally to electric motor control systems, and more particularly, to motor controllers including high-frequency inverters and filter systems to reduce bearing currents induced in electric motors.

In some electric motors using pulse width modulation (PWM) type inverters, a common mode voltage is induced on a motor shaft by switching behavior of semiconductor devices in the inverter. This common mode voltage results in a potential difference across the motor and ground that produces a current that may flow through the motor bearings, i.e., a bearing current. The bearing current reduces a useable lifetime of the bearings and can lead to significant bearing damage. The magnitude of the bearing current is a function of fluctuations or spikes on a waveform generated by an inverter in the motor's control system to drive the motor.

Bearing current may be reduced by mechanical design features, such as grounding brushes. These carbon fiber brushes are disposed in a ring about the bearing surface and create a short-circuit path any induced bearing voltage. However, such grounding brushes increase a total common mode current to ground, which leads to increased electromagnetic interference (EMI) in the motor electronics. Accordingly, a solution for reducing bearing current while also minimizing EMI would be desirable.

BRIEF DESCRIPTION

In one aspect, a motor controller for an electric motor is provided. The motor controller includes a three-phase high-frequency (HF) inverter having a direct current (DC) input stage and an alternating current (AC) output stage, the HF inverter operable at a switching frequency to generate a three-phase output having a fundamental frequency. The motor controller also includes a differential mode (DM) filter coupled in series with the AC output stage of the HF inverter and having a resonant frequency less than 10% of the switching frequency, the DM filter configured to reduce harmonic components of the three-phase output and generate a first filtered output. The motor controller further includes a common mode (CM) filter coupled in series with the DM filter, the CM filter configured to filter the first filtered output to generate a second filtered output having a reduced CM voltage to operate the electric motor with a reduced bearing current.

In another aspect, an electric motor is provided. The electric motor includes a rotor, a stator, at least one bearing disposed between the rotor and the stator, and a motor controller coupled to the stator and configured to provide power the motor. The motor controller includes a three-phase HF inverter having a DC input stage and an AC output stage, the HF inverter operable at a switching frequency to generate a three-phase output having a fundamental frequency. The motor controller also includes a DM filter coupled in series with the AC output stage of the HF inverter and having a resonant frequency less than 10% of the switching frequency, the DM filter configured to reduce harmonic components of the three-phase output and generate a first filtered output. The motor controller further includes a CM filter coupled in series with the DM filter, the CM filter configured to filter the first filtered output to generate a second filtered output having a reduced CM voltage at the stator to energize the stator with a reduced bearing current through the at least one bearing.

In yet another aspect, a method of operating an electric motor is provided. The motor includes a rotor, a stator, and at least one bearing disposed between the rotor and the stator. The method includes receiving, at a HF inverter, a DC input signal, and operating the HF inverter at a switching frequency to generate a three-phase output having a fundamental frequency. The method also includes filtering, by a DM filter having a resonant frequency less than 10% of the switching frequency, the three-phase output to produce a first filtered output having reduced harmonic components, filtering, by a CM filter, the first filtered output to produce a second filtered output having a reduced CM voltage, and energizing the stator using the second filtered output.

BRIEF DESCRIPTION OF THE DRAWINGS

FIGS. 3A and 3B are schematic block diagrams of exemplary differential mode (DM) filters implemented in the motor drive filter system of FIG. 2;

DETAILED DESCRIPTION

Embodiments of the motor controller and method of operating an electric motor described herein facilitate reduced bearing current in an electric motor with a high-frequency (HF) inverter while minimizing electromagnetic interference (EMI). Specifically, as described herein, a motor controller includes an HF inverter implemented using HF wide band gap (WBG) device technology. The motor controller also includes a motor drive filter system formed of AC-side filters in the common-mode voltage conduction path to reduce the common-mode voltage and, thereby, reduce both bearing current and EMI simultaneously.

In the following description, the motor drive filter system is interposed between the HF inverter and the electric motor. In such arrangements, the supply side of any component of the motor drive filter system may be referred to alternatively as an inverter side, upstream, and/or an input side of the component. The load side of any component may be referred to alternatively as a motor side, downstream, or a load size of the component. Current flows as indicated in accompanying figures, from the supply side to the load side.

Figure 1:
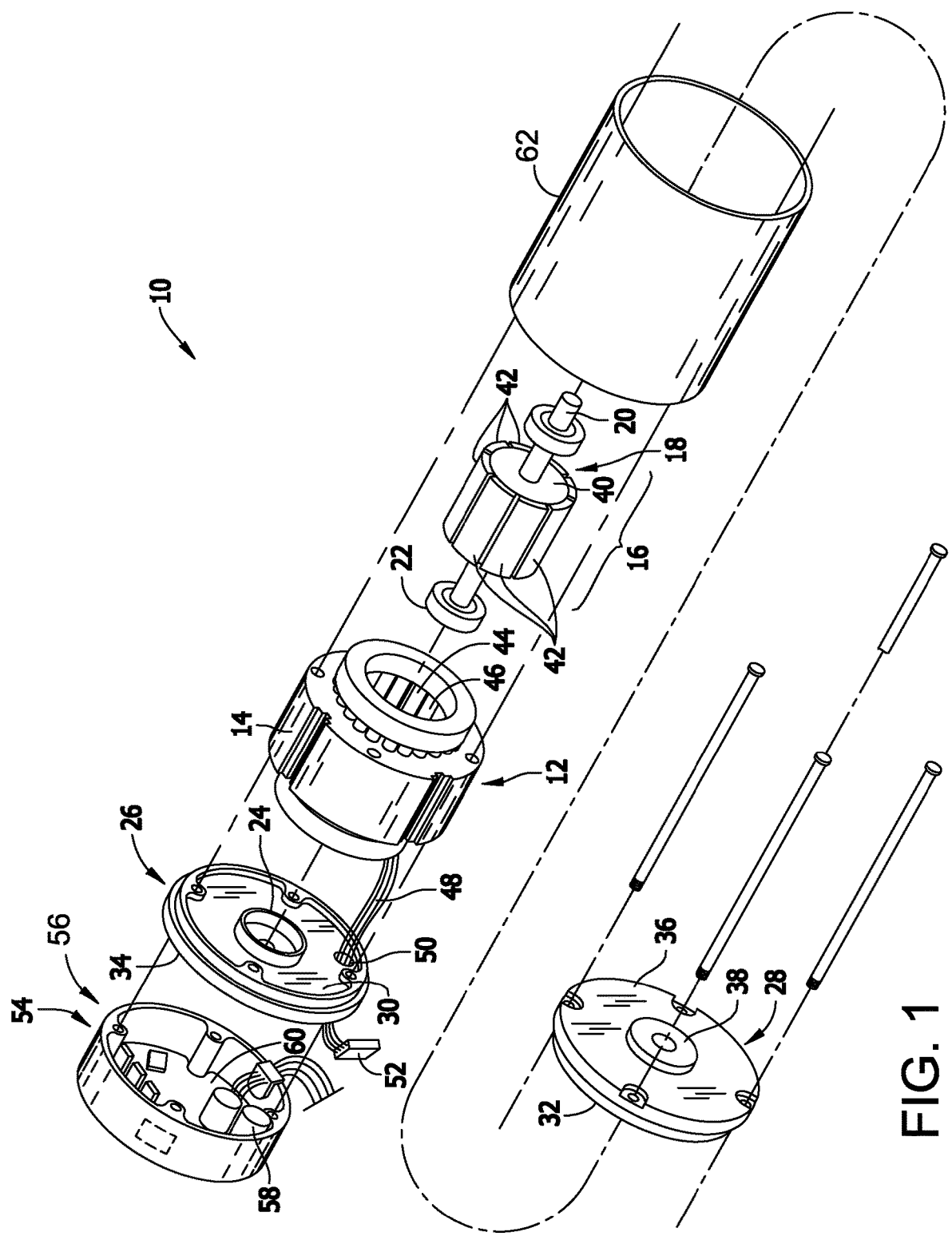
FIG. 1 is an exploded view of an exemplary electric motor.

FIG. 1 is an exploded view of an exemplary motor 10. Motor 10 includes a stationary assembly 12 including a stator or core 14 and a rotatable assembly 16 including a permanent magnet rotor 18 and a shaft 20. In the exemplary embodiment, motor 10 is utilized as a fan and/or blower motor in a fluid (e.g., water, air, etc.) moving system. For example, motor 10 may be utilized in a clean room filtering system, a fan filter unit, a variable air volume system, a refrigeration system, a furnace system, an air conditioning system, and/or a residential or commercial heating, ventilation, and air conditioning (HVAC) system. Alternatively, motor 10 may be implemented in any application that enables motor 10 to function as described herein. Motor 10 may also be used to drive mechanical components other than a fan and/or blower, including mixers, gears, conveyors, pumps, and/or treadmills.

Rotor 18 is mounted on and coupled to shaft 20 for rotation within conventional bearings 22. Bearings 22 are mounted in bearing supports 24 integral with a first end member 26 and a second end member 28. First end member 26 has an inner facing side 30, and second end member 28 has an inner facing side 32. In addition, first end member 26 has an outer side 34, and second end member 28 has an outer side 36. Outer sides 34 and 36 are opposite inner sides 30 and 32 respectively. Stationary assembly 12 and rotatable assembly 16 are located between sides 30 and 32. Additionally, second end member 28 includes an aperture 38 for shaft 20 to extend through outer side 36.

Rotor 18 comprises a ferromagnetic core 40 and is rotatable within stator 14. Rotor core 40 includes a plurality of segments 42 of permanent magnet material, each providing a relatively constant flux field. Segments 42 are secured, for example, by adhesive bonding to rotor core 40. Segments 42 are magnetized to be polarized radially in relation to rotor core 40 with adjacent segments 42 being alternately polarized as indicated. While magnets on rotor 18 are illustrated for purposes of disclosure, it is contemplated that other rotors having different constructions and other magnets different in both number and construction, and flux fields may be utilized with such other rotors within the scope of the invention.

Stationary assembly 12 includes a plurality of windings 44 adapted to be electrically energized by a power source (e.g., utility power) to generate an electromagnetic field, and stator core 14 includes a plurality of teeth 46. Windings 44 are coils of wire wound around teeth 46. Windings 44 terminate in winding terminal leads 48 that are brought out through an aperture 50 in first end member 26 terminating in a connector 52. While stationary assembly 12 is illustrated for purposes of disclosure, it is contemplated that other stationary assemblies of various other constructions having different shapes and with different number of teeth may be utilized within the scope of the invention. Motor 10, in some embodiments, includes any even number of rotor poles and any number of stator poles.

Motor 10 further includes an enclosure 54 that mounts on the rear portion of motor 10. A motor controller 56 includes a plurality of electronic components 58 and a connector (not shown) mounted on a component board 60, such as a printed circuit board. Motor controller 56 is connected to winding stages 44 by interconnecting connector 52. Motor controller 56 applies a current to one or more of winding stages 44 at a time for commutating windings 44 in a preselected sequence to rotate rotatable assembly 16 about an axis of rotation.

A housing 62 is positioned between first end member 26 and second end member 28 to facilitate enclosing and protecting stationary assembly 12 and rotatable assembly 16.

Figure 2:
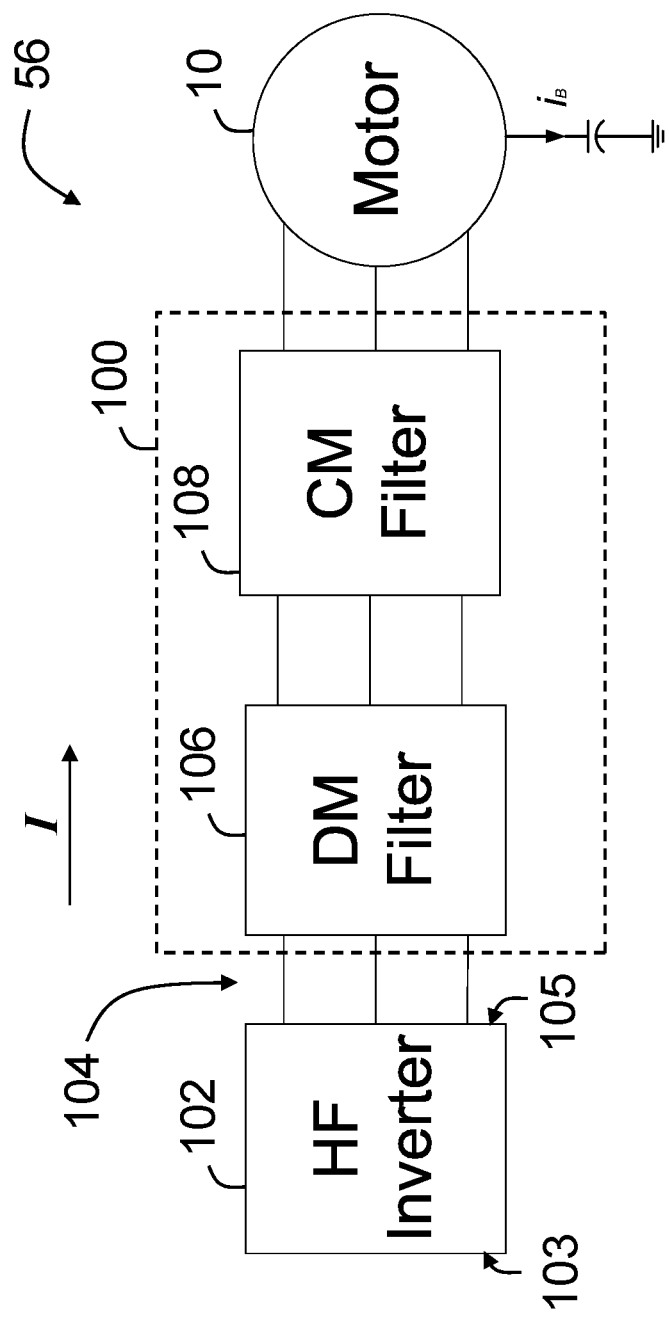
FIG. 2 is a block diagram of a motor controller including a first exemplary motor drive filter system.

FIG. 2 is a block diagram of a motor controller 56 including a first exemplary motor drive filter system 100. In particular, motor drive filter system 100 is interposed between an HF inverter 102 and motor 10. HF inverter 102 includes a direct current (DC) input stage 103 configured to receive an input DC signal from a DC power source (not shown), such as a rectifier or other electronic component (e.g., one or more of electronic components 58, shown in FIG. 1). HF inverter 102 is configured to generate a three-phase output 104 that is output at an alternating current (AC) stage 105. HF inverter 102, in the example embodiment, is implemented using high-frequency wide band gap (WBG) device technology, such as SiC or GaN semiconductor devices, which facilitates a more compact inverter with lower switching losses when compared to other high-switching frequency technology. HF inverter 102 has a high switching frequency (i.e., the rate at which the input DC signal is turned on and off to generate the three-phase output 104), and three-phase output 104 defines a fundamental frequency (i.e., frequency of the fundamental waveform output by HF inverter 102). In the example embodiment, the switching frequency of HF inverter 102 is above about 50 kHz, such as between about 100 kHz and about 1 MHz. The fundamental frequency the AC output signal from HF inverter 102 is below about 1 kHz, or below about 500 Hz, or about 200 Hz. Compared to motor controllers implemented using lower switching-frequency inverters, the increased filter frequency of HF inverter 102 results in an increased power density and an improved approximation of a sine wave, which can improve motor efficiency.

Motor drive filter system 100 includes a differential mode (DM) filter 106 and a common mode (CM) filter 108 coupled in series on the AC-side of HF inverter 102, each described further herein. The filtered output from DM filter 106 to CM filter 108 may be referred to as a "first filtered output," and the filtered output from the CM filter 108 to operate motor 10 may be referred to as a "second filtered output." Motor drive filter system 100 facilitates the implementation of HF inverter 102 while reducing or eliminating bearing current induced at motor 10 and simultaneously reducing electromagnetic interference (EMI) across the motor's electrical components 58. The combination of the filters 106, 108 in motor drive filter system 100 reduces harmonic distortion in the voltage/current output to motor 10, and may further increase efficiency of motor 10.

FIG. 3A is a schematic block diagram of a first exemplary DM filter 106A implemented in motor drive filter system 100 (shown in FIG. 2). DM filter 106A is implemented as an L-C filter with a current-limiting and damping resistor. More specifically, DM filter 106A includes a respective inductor 110 coupled in series with each output phase 112, 114, 116 of HF inverter 102, as well as a respective leg 118 coupled between each pair of output phases. Each leg 118 includes a respective capacitor 120 providing a path to filter the harmonics in the output signal from HF inverter 102. Capacitors 120 can experience a relatively high current; this current is undesirable as it can cause excessive heating. Accordingly, legs 118 further include resistors 122 to limit the current through capacitors 120. In addition, resistors 122 are configured to damp resonance behavior of motor drive filter system 100.

FIG. 3B is a schematic block diagram of a second exemplary DM filter 106B implemented in motor drive filter system 100 (shown in FIG. 2). DM filter 106B is implemented as an L-C filter with a damping resistor. More specifically, DM filter 106B includes a respective inductor 124 coupled in series with each output phase 112, 114, 116 of HF inverter 102, a respective damping resistor 126 coupled in parallel with each inductor 124, and a respective capacitor 128 coupled between each pair of output phases

112, 114, 116. Resistors 126 are used to damp resonance behavior of motor drive filter system 100 and/or to limit the current through capacitors 128.

DM filters 106A, 106B (collectively 106) are configured to remove harmonics in the output signal from HF inverter 102, and to transform the line-to-line output signal (i.e., the voltage across output phase pairs) to an improved sinusoidal waveform by reducing voltage "spikes" away from the fundamental output waveform from HF inverter 102. Further, by reducing voltage spikes, DM filters 106 lower the common mode voltage (i.e., the potential difference between the motor stator 14 and ground) at motor 10, reducing motor bearing currents.

In the exemplary embodiment, the specific inductors 110/124 and capacitors 120/128 of DM filters 106 are selected such that DM filter 106 has a resonant frequency ranging from about twice the maximum fundamental frequency the output waveform from HF inverter 102 to about 10% of the switching frequency of HF inverter 102. For example, DM filter 106 may have a resonant frequency above about 400 Hz, or above about 1 kHz, or above about 2 kHz. DM filter 106 may have a resonant frequency below about 100 kHz, or below about 10 kHz. The resonant frequency of any L-C filter is defined as $$f_r = \frac{1}{2\pi\sqrt{LC}}.$$

As the switching frequency of HF inverter 102 increases (i.e., the time scale of the switching decreases), the size of DM filter 106 may be decreased. In theory:

$$L\frac{di}{dt} = v \rightarrow \frac{L}{K} \times \frac{di}{\frac{dt}{k}} = v \quad \text{Eq. (1)}$$

$$C\frac{dv}{dt} = i \rightarrow \frac{C}{K} \times \frac{dv}{\frac{dt}{k}} = i, \quad \text{Eq. (2)}$$

where dt generally relates to the time spent for each switching event. That is, in Equations 1 and 2, as dt is decreased (by increasing the switching frequency of HF inverter 102), the inductors 110/124 and capacitors 120/128 can be reduced and output the same average voltage (v) and current (i). Although the circuit design, when implemented, may not share this precise inversely proportional relationship between a frequency increase and a filter size decrease (each by "k" times), the relationship is generally inverse (e.g., a frequency increase by "k" may allow for a filter size decrease by "k/2"). Accordingly, by increasing the available frequency output of an HF inverter 102 (as compared to traditional, lower-frequency motor designs), an overall size of the filter system 100 may be reduced. In turn, more compact motor designs are enabled.

Figure 4B:
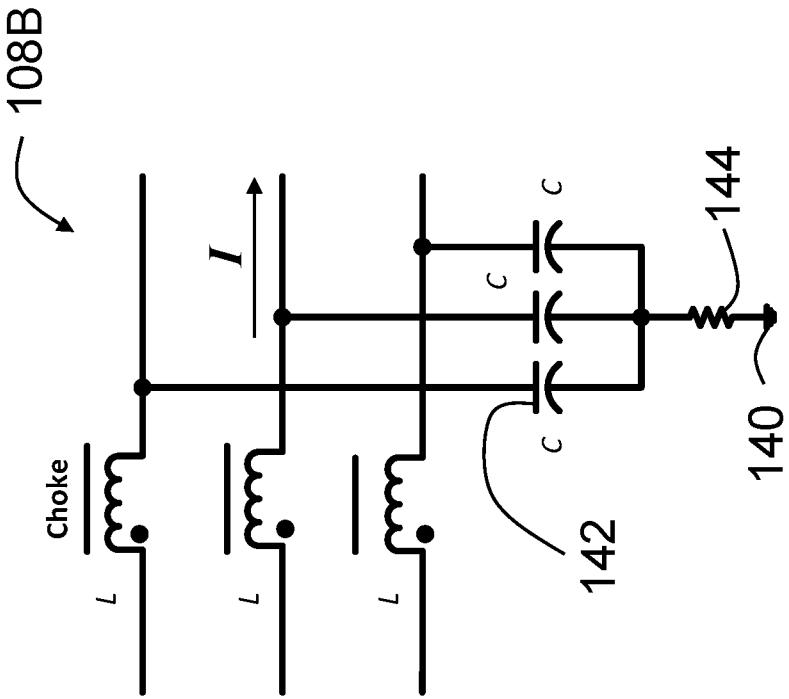
FIGS. 4A and 4B is are schematic block diagrams of exemplary common mode (CM) filters implemented in the motor drive filter system of FIG. 2.
Figure 4A:
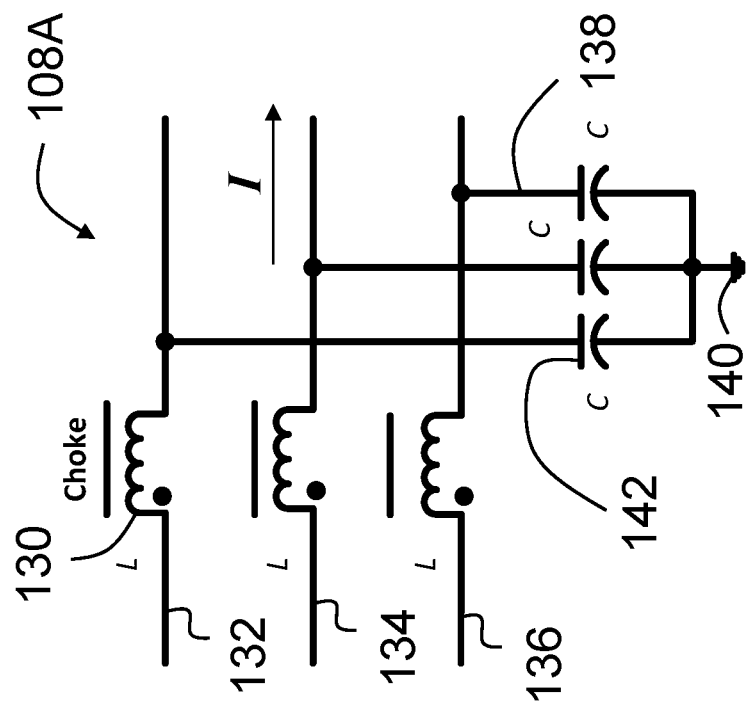

FIG. 4A is a schematic block diagram of a first exemplary CM filter 108A implemented in motor drive filter system 100 (shown in FIG. 2). In the illustrated embodiment, CM filter 108A includes a respective inductor choke 130 coupled in series with each output phase 132, 134, 136 from the DM filter 106 (also shown in FIG. 1) and a respective leg 138 coupled between an output of each inductor choke 130 and a ground 140. Each leg 138 includes a respective capacitor 142 providing a path to ground 140 to reduce a common-mode voltage across CM filter 108A.

FIG. 4B is a schematic block diagram of a second exemplary CM filter 108B implemented in motor drive filter system 100 (shown in FIG. 1). CM filter 108B is substantially similar to CM filter 108A, except in that CM filter 108B further includes a resistor 144 coupled in series between legs 138 and ground 140. Resistor 144 is used to damp resonance behavior of motor drive filter system 100 and/or to limit the current through capacitors 142.

CM filters 108A, 108B (collectively "108") are configured to significantly reduce common-mode voltage at motor 10 (shown in FIG. 1) to significantly reduce bearing currents therein. In particular, CM filters 108 provide a common-mode current bypass path. In the exemplary embodiment, the specific inductance of inductor chokes 130 and capacitance of capacitors 138 of CM filters 108 are selected such that each CM filter 108 has a resonant frequency significantly lower than the switching frequency of HF inverter 102, for example, up to about 20% of the switching frequency. For example, CM filter 108 may have a resonant frequency from about 20 kHz to about 200 kHz.

Figure 5:
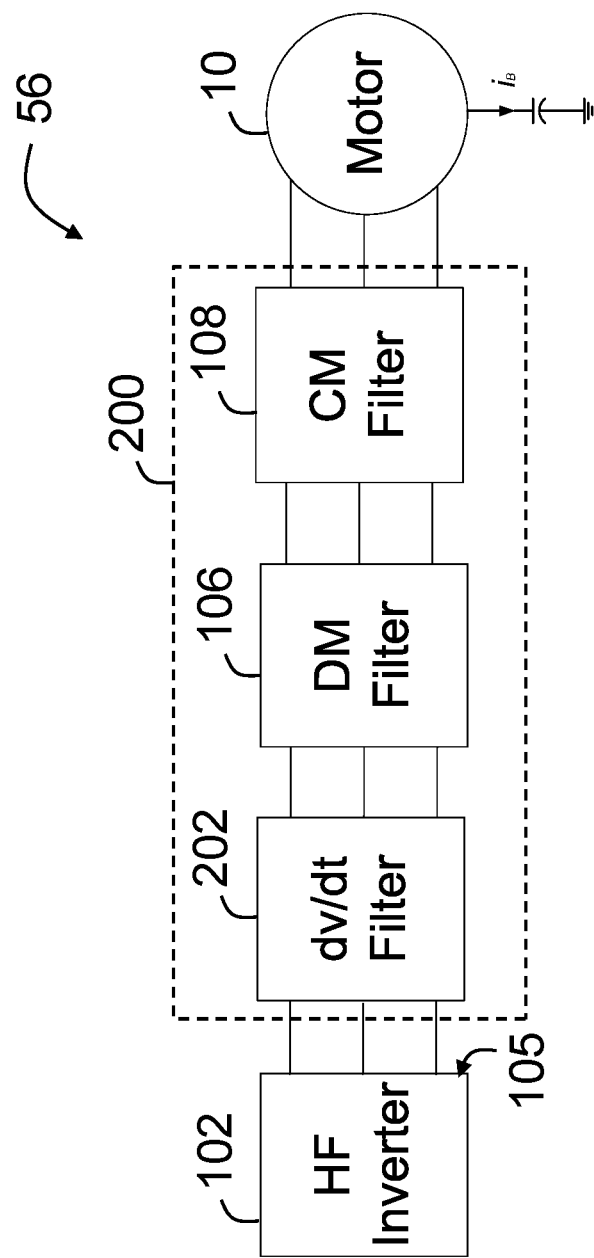
FIG. 5 is a block diagram of a motor controller including a second exemplary motor drive filter system.

FIG. 5 is a block diagram of motor controller 56 including a second exemplary motor drive filter system 200. In particular, motor drive filter system 200 is interposed between HF inverter 102 (as shown in FIG. 2) and motor 10. Motor drive filter system 200 includes a DM filter 106 and a CM filter 108, as described herein, as well as a high-frequency filter 202 coupled in series on the AC-side HF inverter 102. In the illustrated embodiment, high-frequency filter 202 is coupled to AC output stage 105 of HF inverter 102. High-frequency filter 202 is configured to filter, or reduce, a high-frequency component of line-to-line voltages (i.e., reduce voltage "spikes" away from the fundamental sinusoidal waveform) caused by switching behavior of the semiconductor devices of HF inverter 102. Accordingly, high-frequency filter 202 may be referred to as a "dv/dt filter" 202. In motor drive systems without a dv/dt filter 202 (e.g., motor drive system 100, shown in FIG. 2), this high-frequency component of the inverter output signal may be filtered, for example, using suitable gate driver designs.

Figure 6:
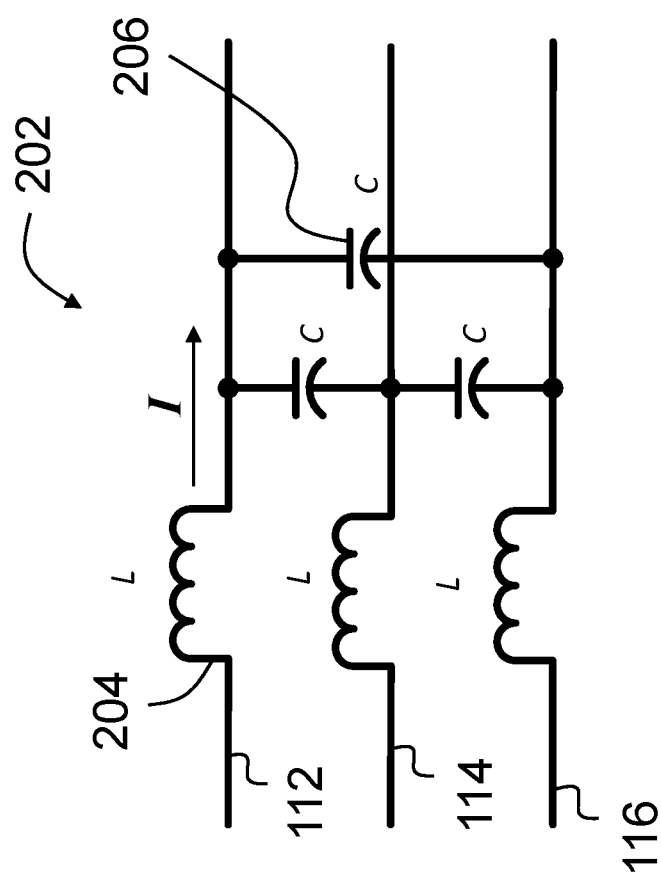
FIG. 6 is a schematic block diagram of an exemplary dv/dt filter implemented in the motor drive filter system shown in FIG. 5.

FIG. 6 is a schematic block diagram of an exemplary dv/dt filter 202 implemented in motor drive filter system 200 (shown in FIG. 5). The dv/dt filter 202 includes a respective inductor 204 coupled in series with each output phase 112, 114, 116 of HF inverter 102, and a respective capacitor 206 coupled between each pair of output phases 112, 114, 116. The specific inductors 204 and capacitors 206 of dv/dt filter 202 are selected such that dv/dt filter 202 has a resonant frequency much higher than the switching frequency of HF inverter 102. For example, dv/dt filter 202 may have a resonant frequency about 10 times the inverter switching frequency, such as from about 1 MHz to about 10 MHz. In the exemplary embodiment, the capacitance of capacitors 206 of dv/dt filter 202 is significantly smaller than the capacitance of capacitors 120/128 of DM filter(s) 106 (shown in FIGS. 3A and 3B). For motor drive filter system 200, a suitable DM filter 106 should be implemented with respect to output phases from dv/dt filter 202, as opposed to output phases from HF inverter 102, as in motor filter system 100 (shown in FIG. 2). The filtered output from dv/dt filter may be referred to as a "frequency filtered output," and, in such embodiments, DM filter 106 operates on, or filters, the frequency filtered output to generate the first filtered output, as described above.

Figure 7:
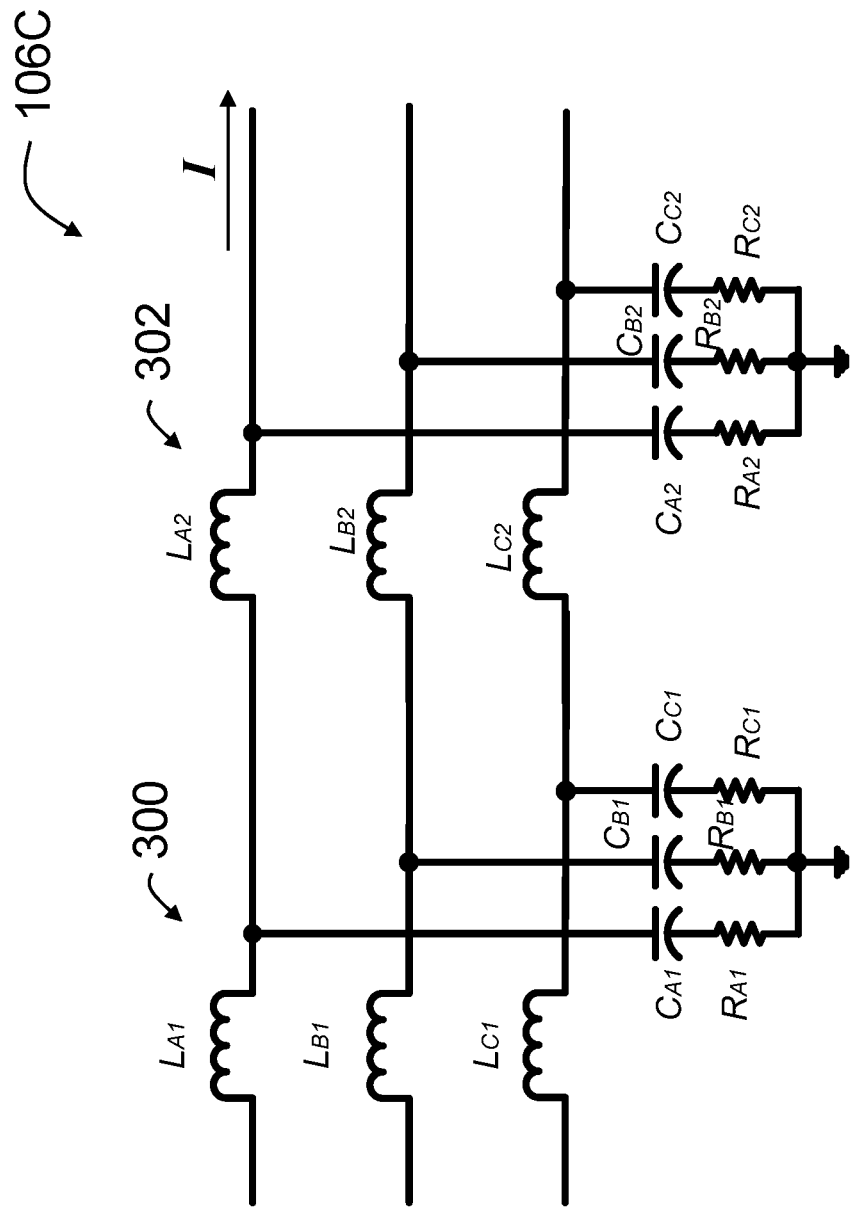
FIG. 7 is a schematic block diagram of an exemplary two-stage DM filter that may be implemented in the motor drive filter system(s) of FIG. 2 and/or FIG. 5.

In various alternative embodiments of motor drive filter systems, any of the filters 106, 108, 202 may be implemented in more than one stage. For example, FIG. 7 is a schematic block diagram of an exemplary two-stage DM filter 106C that may be implemented in the motor drive filter system(s) 100, 200 of FIG. 2 and/or FIG. 5. In such embodiments, each stage 300, 302 has different resonant frequency value. More specifically, the various values of inductance ($L_{A1}$, $L_{B1}$, $L_{C1}$) and capacitance ($C_{A1}$, etc.) of the first-stage DM filter 300 and the various values of inductance ($L_{A2}$, etc.) and capacitance ($C_{A2}$, etc.) of the second-stage DM filter 302 may be specifically selected to "tune" the respective resonant frequencies of DM filters 300, 302 as desired.

Figure 8:
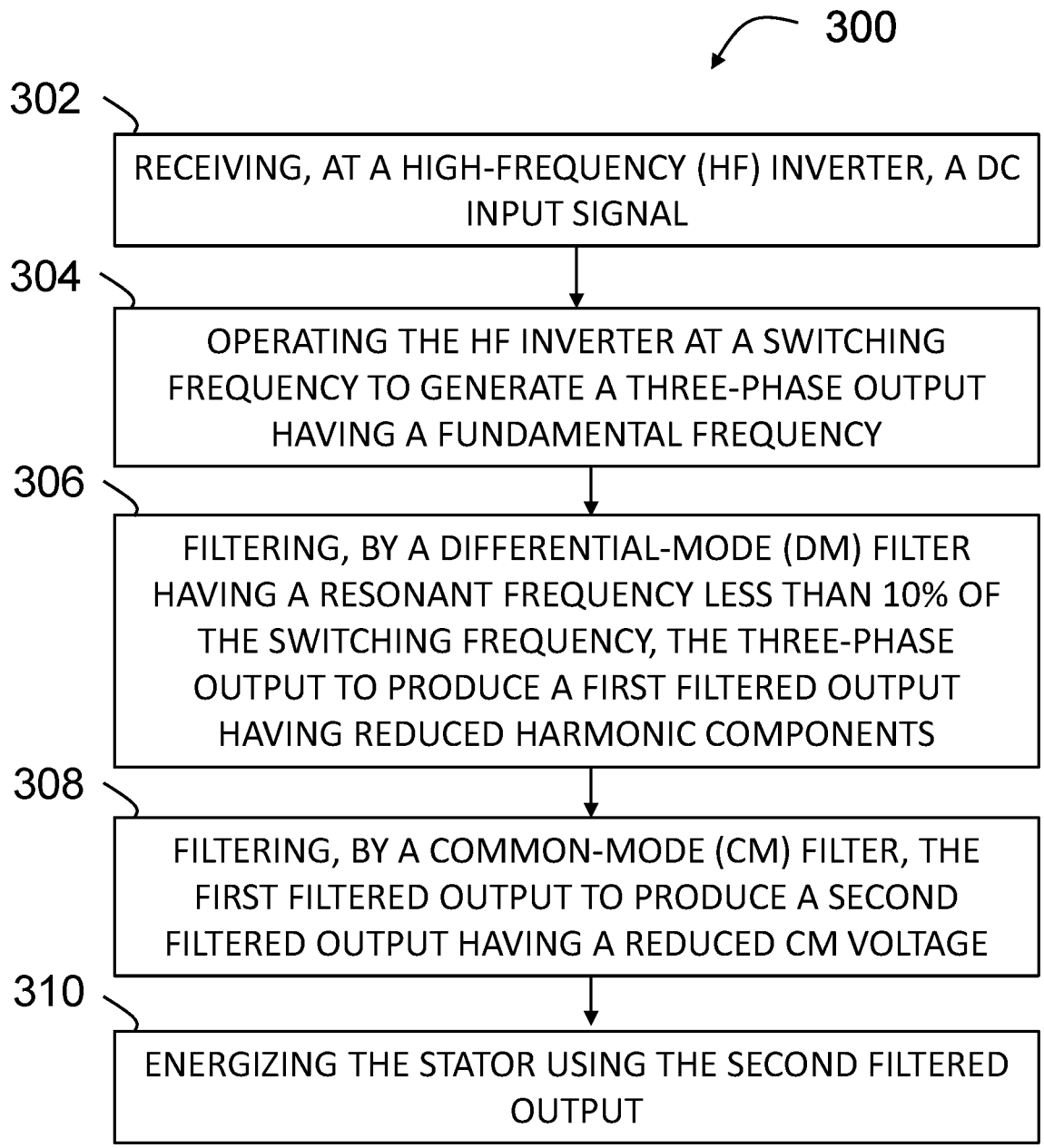
FIG. 8 is a flow diagram of a method for operating an electric motor.

FIG. 8 is a flow diagram illustrating a method 300 for operating an electric motor (e.g., motor 10, shown in FIG. 1). Method 300 may be implemented using motor controller 56 (also shown in FIG. 1) including motor drive system 100 (shown in FIG. 2) or motor drive system 200 (shown in FIG. 5). In the exemplary embodiment, the motor includes a rotor (e.g., rotor 18), a stator (e.g., stator 14), and at least one bearing (e.g., bearing 22, all shown in FIG. 1).

In the exemplary embodiment, method 300 includes receiving 302, at a high-frequency (HF) inverter (e.g., HF inverter 102, shown in FIG. 2), a DC input signal. Method 300 also includes operating 304, the HF inverter at a switching frequency, to generate a three-phase output (e.g., three-phase output 104, also shown in FIG. 2) having a fundamental frequency.

Method 300 further includes filtering 306, by a differential-mode (DM) filter (e.g., DM filter 106, shown in FIG. 2) having a resonant frequency less than 10% of the switching frequency, the three-phase output to produce a first filtered output having reduced harmonic components. Method 300 also includes filtering 308, by a common-mode (CM) filter (e.g., CM filter 108, also shown in FIG. 2), the first filtered output to produce a second filtered output having a reduced CM voltage. Method 300 includes energizing 310 the stator using the second filtered output.

In the foregoing specification and the claims that follow, a number of terms are referenced that have the following meanings.

As used herein, an element or step recited in the singular and preceded with the word "a" or "an" should be understood as not excluding plural elements or steps, unless such exclusion is explicitly recited. Furthermore, references to "example implementation" or "one implementation" of the present disclosure are not intended to be interpreted as excluding the existence of additional implementations that also incorporate the recited features.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here, and throughout the specification and claims, range limitations may be combined or interchanged. Such ranges are identified and include all the sub-ranges contained therein unless context or language indicates otherwise.

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to provide details on the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A motor controller for an electric motor, the motor controller comprising:
   a three-phase high-frequency (HF) inverter having a direct current (DC) input stage and an alternating current (AC) output stage, the HF inverter operable at a switching frequency to generate a three-phase output having a fundamental frequency;
   a differential mode (DM) filter coupled in series with the AC output stage of the HF inverter and having a resonant frequency less than 10% of the switching frequency, the DM filter configured to reduce harmonic components of the three-phase output and generate a first filtered output;
   a common mode (CM) filter coupled in series with the DM filter, the CM filter configured to filter the first filtered output to generate a second filtered output having a reduced CM voltage to operate the electric motor with a reduced bearing current; and
   a high-frequency filter coupled between the HF inverter and the DM filter, the high-frequency filter configured to produce a frequency filtered output having a reduced line-to-line voltage spike.

2. The motor controller of claim 1, wherein the switching frequency of the HF inverter is greater than about 100 kHz.

3. The motor controller of claim 1, wherein the fundamental frequency of three-phase output is below about 1 kHz.

4. The motor controller of claim 1, wherein the resonant frequency of the DM filter is at least twice the fundamental frequency of the three-phase output.

5. The motor controller of claim 1, wherein the CM filter has a resonant frequency less than 20% of switching frequency of the HF inverter.

6. The motor controller of claim 1, wherein the DM filter comprises a respective inductor coupled in series with each output phase of the HF inverter, and a respective leg coupled between each pair of output phases, each leg comprising a capacitor in series with a resistor.

7. The motor controller of claim 1, wherein the DM filter comprises a respective inductor coupled in series with each output phase of the HF inverter, a respective damping resistor coupled in parallel with each inductor, and a respective capacitor coupled between each pair of output phases.

8. The motor controller of claim 1, wherein the CM filter comprises a respective inductor choke coupled in series with each output phase from the DM filter, and a respective leg coupled between an output of each inductor choke and a ground, each leg comprising a capacitor.

9. The motor controller of claim 8, wherein the CM filter further comprises a resistor coupled in series between each leg and the ground.

10. The motor controller of claim 1, wherein the high-frequency filter has a resonant frequency greater than ten times the switching frequency of the HF inverter.

11. The motor controller of claim 10, wherein the high-frequency filter comprises a respective inductor coupled in series with each output phase of the HF inverter, and a respective capacitor coupled between each pair of output phases.

12. An electric motor comprising:
a rotor;
a stator;
at least one bearing disposed between the rotor and the stator; and
a motor controller coupled to the stator and configured to provide power the motor, the motor controller comprising:
 a three-phase high-frequency (HF) inverter having a direct current (DC) input stage and an alternating current (AC) output stage, the HF inverter operable at a switching frequency to generate a three-phase output having a fundamental frequency;
 a differential mode (DM) filter coupled in series with the AC output stage of the HF inverter and having a resonant frequency less than 10% of the switching frequency, the DM filter configured to reduce harmonic components of the three-phase output and generate a first filtered output;
 a common mode (CM) filter coupled in series with the DM filter, the CM filter configured to filter the first filtered output to generate a second filtered output having a reduced CM voltage at the stator to energize the stator with a reduced bearing current through the at least one bearing; and
 a high-frequency filter coupled between the HF inverter and the DM filter, the high-frequency filter configured to produce a frequency filtered output having a reduced line-to-line voltage spike.

13. The electric motor of claim 12, wherein the switching frequency of the HF inverter is greater than about 100 kHz and the fundamental frequency of the three-phase output is below about 1 kHz.

14. The electric motor of claim 12, wherein the resonant frequency of the DM filter is at least twice the fundamental frequency of the three-phase output.

15. The electric motor of claim 12, wherein the CM filter has a resonant frequency less than 20% of switching frequency of the HF inverter.

16. The electric motor of claim 12, wherein the DM filter comprises a respective inductor coupled in series with each output phase of the HF inverter, and a respective leg coupled between each pair of output phases, each leg comprising a capacitor in series with a resistor.

17. The electric motor of claim 12, wherein the CM filter comprises a respective inductor choke coupled in series with each output phase from the DM filter, and a respective leg coupled between an output of each inductor choke and a ground, each leg comprising a capacitor.

18. A method of operating an electric motor including a rotor, a stator, and at least one bearing disposed between the rotor and the stator, the method comprising:
receiving, at a high-frequency (HF) inverter, a DC input signal;
operating the HF inverter at a switching frequency to generate a three-phase output having a fundamental frequency;
filtering, by a high-frequency filter, the three-phase output to produce a frequency-filtered output having a reduced line-to-line voltage spoke;
filtering, by a differential-mode (DM) filter having a resonant frequency less than 10% of the switching frequency, the frequency-filtered output to produce a first filtered output having reduced harmonic components;
filtering, by a common-mode (CM) filter, the first filtered output to produce a second filtered output having a reduced CM voltage; and
energizing the stator using the second filtered output.

* * * * *